United States Patent
Howard

[19]

[11] Patent Number: 6,117,767

[45] Date of Patent: *Sep. 12, 2000

[54] METHOD OF FORMING AN INTEGRATED CIRCUIT STRUCTURE

[75] Inventor: Bradley J. Howard, Boise, Id.

[73] Assignee: Micron Technology, Inc.

[*] Notice: This patent is subject to a terminal disclaimer.

[21] Appl. No.: 09/245,996

[22] Filed: Feb. 5, 1999

Related U.S. Application Data

[63] Continuation of application No. 08/551,479, Nov. 1, 1995, Pat. No. 5,897,372.

[51] Int. Cl.[7] .............................................. H01L 21/4763
[52] U.S. Cl. .......................... 438/637; 438/672; 438/724
[58] Field of Search .................................... 438/597, 637, 438/672, 724; 257/760, 748, 754

[56] References Cited

U.S. PATENT DOCUMENTS

| | | |
|---|---|---|
| 4,870,470 | 9/1989 | Bass, Jr. et al. . |
| 5,010,039 | 4/1991 | Ku et al. . |
| 5,470,793 | 11/1995 | Kalnitsky . |
| 5,622,596 | 4/1997 | Armacost et al. . |
| 5,897,372 | 4/1999 | Howard ................................. 438/637 |

*Primary Examiner*—Caridad Everhart
*Attorney, Agent, or Firm*—Workman, Nydegger & Seeley

[57] ABSTRACT

Silicon-rich silicon nitride is employed as a protective layer in a self-aligning etch. A thin layer of silicon-rich silicon nitride is deposited conformably over raised structures on a substrate. An etchable layer is then deposited, filling a space between the raised structures and providing a horizontal top surface. A mask layer is then formed on the etchable layer and patterned to expose an area of the etchable layer over the space between the raised structures. The etchable layer is then etched with an etchant selective to silicon nitride to remove the etchable layer from between the raised structures. Then the space between the raised structures is filled with a fill material, forming a self-aligned structure comprised of said fill material and self-aligned to the raised structures. The thin layer of silicon-rich silicon nitride resists the etch of the etchable layer better than the typical stoichiometric silicon nitride, providing increased selectivity, improving the reliability of the self-aligning process by preventing etch-through of protective layers, and thereby improving process control and yield of the self-aligning process.

27 Claims, 4 Drawing Sheets

METHOD OF FORMING AN INTEGRATED CIRCUIT STRUCTURE

RELATED APPLICATIONS

This application is a continuation of U.S. patent application Ser. No. 08/551,479, filed on Nov. 1, 1995, titled "Formation of a Self-Aligned Integrated Circuit Structure Using Silicon-Rich Nitride As a Protective Layer", now U.S. Pat. No. 5,897,372 which is incorporated herein by reference.

THE FIELD OF THE INVENTION

The present invention relates to semiconductor devices and the manufacture thereof. More particularly, the present invention is directed to a method for forming self-aligned integrated circuit structures using silicon-rich nitride as a protective layer.

BACKGROUND OF THE INVENTION

The Relevant Technology

Self-aligned structures in an integrated circuit may be formed by shielding previously formed raised structures with a protective layer. An etchable layer is then typically deposited over the shielded previously formed structures, and a masking layer is deposited on the etchable layer and patterned. The etchable layer is then etched. The protective layer resists etching and shields the previously formed structures, effectively steering the etch around and between the previously formed structures, leaving spaces free of the etchable layer which are self-aligned to the previously formed structures. A fill material is then deposited to fill the spaces, forming structures comprised of fill material self-aligned to the previously formed structures.

The material which must be etched to form contact structures in a MOS process is typically an oxide of silicon such as borophosphorous silica glass (BPSG). Silicon nitride or silicon-rich silicon oxide is typically used to form protective layers resistant to silicon oxide etching. Silicon nitride is typically preferred. Protective layers are formed over structures such as wordlines around which the contacts must be routed. Etchants selective to the material of the protective layer etch the BPSG preferentially to the protective layer, resulting in spaces which are self-aligned to the surrounding structures. These spaces are then filled with a conductive material or materials to form the self-aligned contacts.

The higher the selectivity of the BPSG etchant to the material of the protective layer, the less likely the protective layer is to be breached during etching of the contact spaces. Increased etch selectivity can thus improve the reliability, control, and yield of the process of forming self-aligned contacts, potentially allowing denser spacing of circuit devices and improving process yields for the contact forming process.

SUMMARY AND OBJECTS OF THE INVENTION

An object of the present invention is to provide an improved method for forming self-aligned integrated circuit structures, and particularly self-aligned contact structures, in which method the likelihood of a breach of a protective layer is decreased.

Another object of the present invention is to provide an improved method for forming self-aligned integrated circuit structures, and particularly self-aligned contact structures, in which method the selectivity of an etchant to a protective layer is increased.

Another object of the present invention is to provide an improved method for forming self-aligned integrated circuit structures, and particularly self-aligned contact structures, said method providing increased process control, reliability and yield.

In accordance with the method of the present invention, silicon-rich silicon nitride is deposited conformably over raised structures on a substrate. An etchable layer is then deposited, filling a space between the raised structures and providing a horizontal top surface. A mask layer is then formed on the etchable layer and patterned to expose an area of the etchable layer over the space between the raised structures. The etchable layer is then etched with an etchant selective to silicon nitride to remove the etchable layer from between the raised structures. Then the space between the raised structures is filled with a fill material, forming a self-aligned structure comprised of said fill material and self-aligned to the raised structures. If the self-aligned structures are contact structures, the thin layer of silicon-rich silicon nitride is removed from the exposed substrate prior to filling the space with the fill material.

The thin layer of silicon-rich silicon nitride resists the etch of the etchable layer better than the typical stoichiometric silicon nitride protective layer, providing increased selectivity, improving the reliability of the self-aligning process by preventing etch-through of protective layers, and thereby improving process control and yield of the self-aligning process.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention introduces the use of silicon-rich silicon nitride as a protective layer in self-aligned etching during the production of integrated circuits. Benefits of the method of the present invention include increased selectivity of the self-aligning etch, with resulting improved process control and yield.

Figure 1:
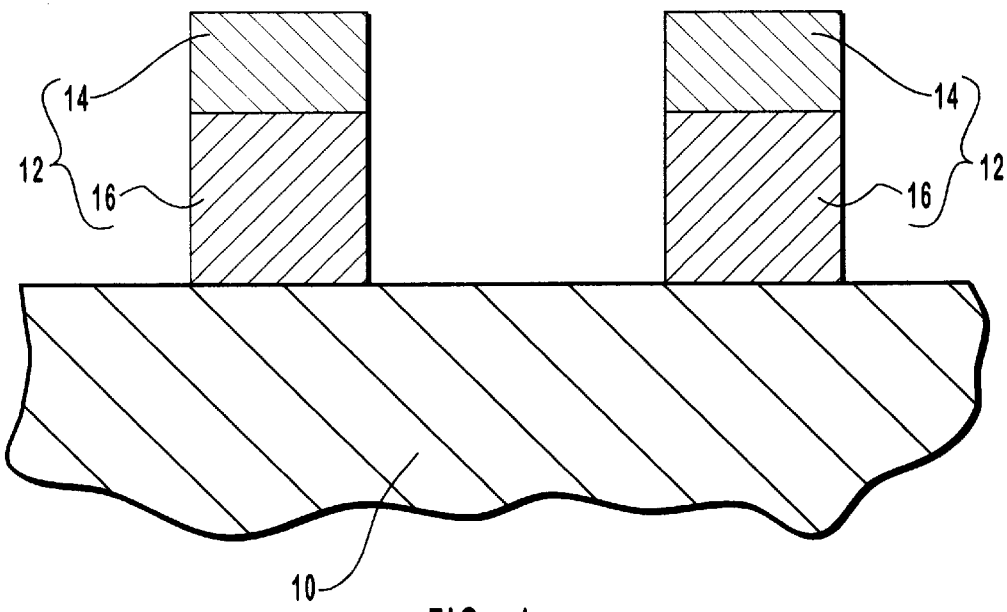
FIG. 1 is a partial cross section of a partially formed integrated circuit.

FIG. 1 is a partial cross section of a partially formed integrated circuit. Stack layers have been deposited on substrate 10 and patterned to form stacks 12, such as gate or wordline stacks, each including a top layer 14 of a protective material such as silicon nitride or silicon oxide and an underlying structure 16 which may include one or more layers as required by the particular design.

Figure 2:
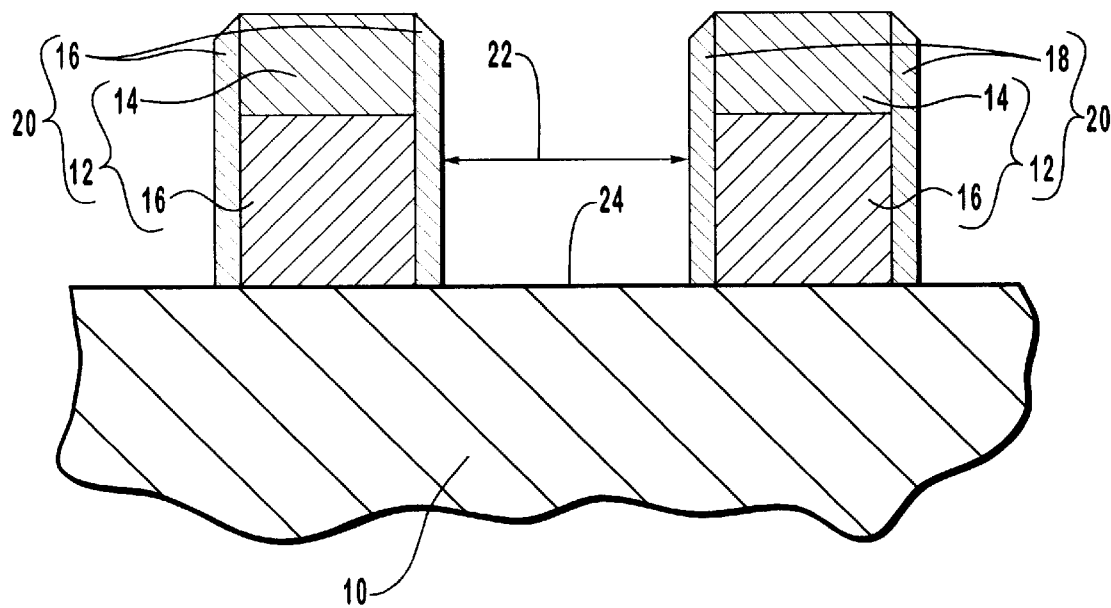
FIG. 2 is the cross section of FIG. 1 after the formation of spacers.

A spacer layer of protective material is then deposited over substrate 10 and stacks 12, and etched anisotropically to form spacers 18 as shown in FIG. 2. Each of stacks 12, together with spacers 18 associated therewith forms a raised structure 20 to which a subsequently formed structure will be self-aligned. Spacers 18 are preferably formed of the same protective material as top layers 14. Raised structures 20 have a space 22 therebetween. Area 24 of substrate 10 lies between raised structures 20.

Figure 3:
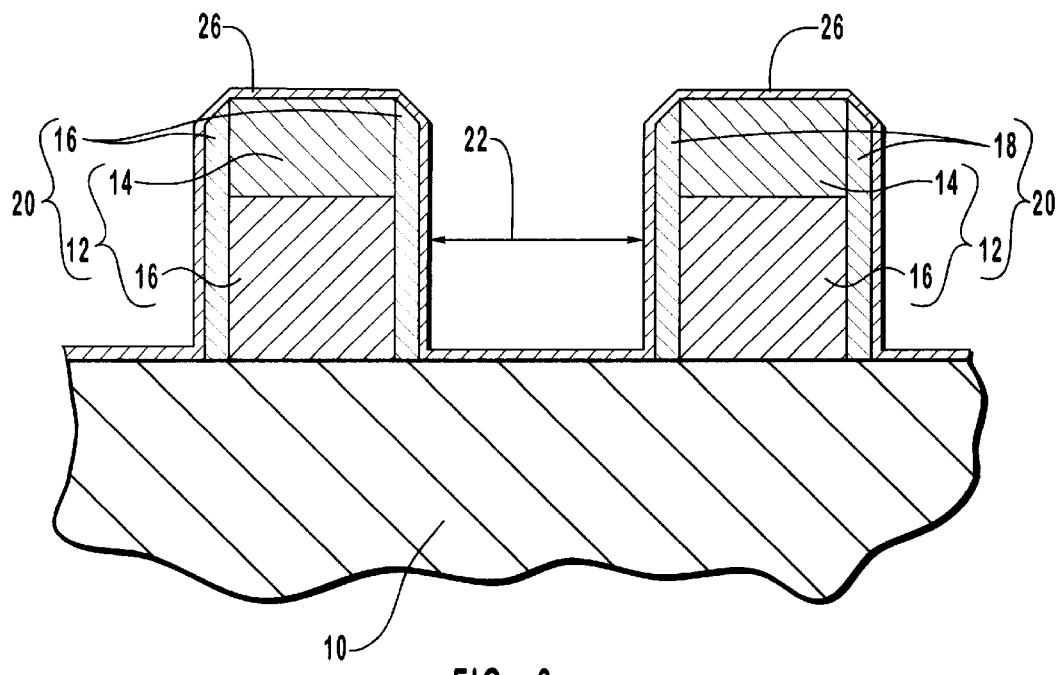
FIG. 3 is the cross section of FIG. 2 after deposition of a thin layer of silicon-rich silicon nitride.

After spacers 18 have been formed, a thin layer of silicon-rich silicon nitride 26 is deposited conformably over raised structures 20, as shown in FIG. 3. Silicon-rich silicon nitride layer 26 preferably has a thickness in the range of about 50 to about 500 Angstroms, such that it provides the desired etch resistance described below without substantially decreasing the width of space 22. The ratio of silicon to nitride in silicon-rich silicon nitride layer 26 is preferably such that the index of refraction of thin layer of silicon-rich silicon nitride 26 is within the range of about 2.1 to about 2.6, so that layer 26 has the increased etch resistance described below and remains sufficiently non-conductive. Silicon-rich silicon nitride layer 26 may be deposited by any method, but is preferably deposited by LPCVD.

Figure 4:
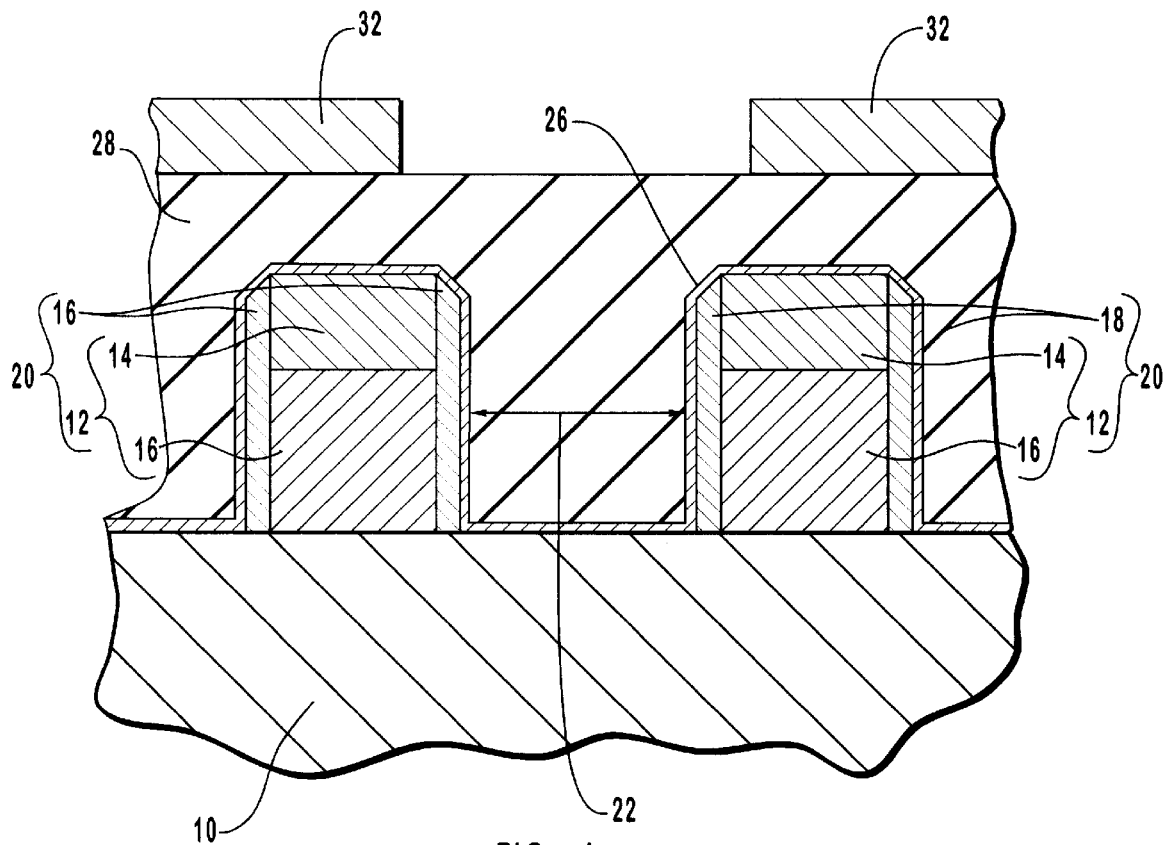
FIG. 4 is the cross section of FIG. 3 after deposition of an etchable layer and deposition and patterning of a mask layer.

An etchable layer 28, such as silicon oxide or a doped silicon oxide such as BPSG, is then deposited over substrate 10 and raised structures 12 as shown in FIG. 4. A horizontal upper surface is provided on etchable layer 28 by any suitable method, such as by reflowing layer 28. A mask layer 32 is then deposited on etchable layer 28 and patterned to expose an area of etchable layer 28 over space 22, as also shown in FIG. 4. Photoresist or other masking layers may be employed.

Figure 5:
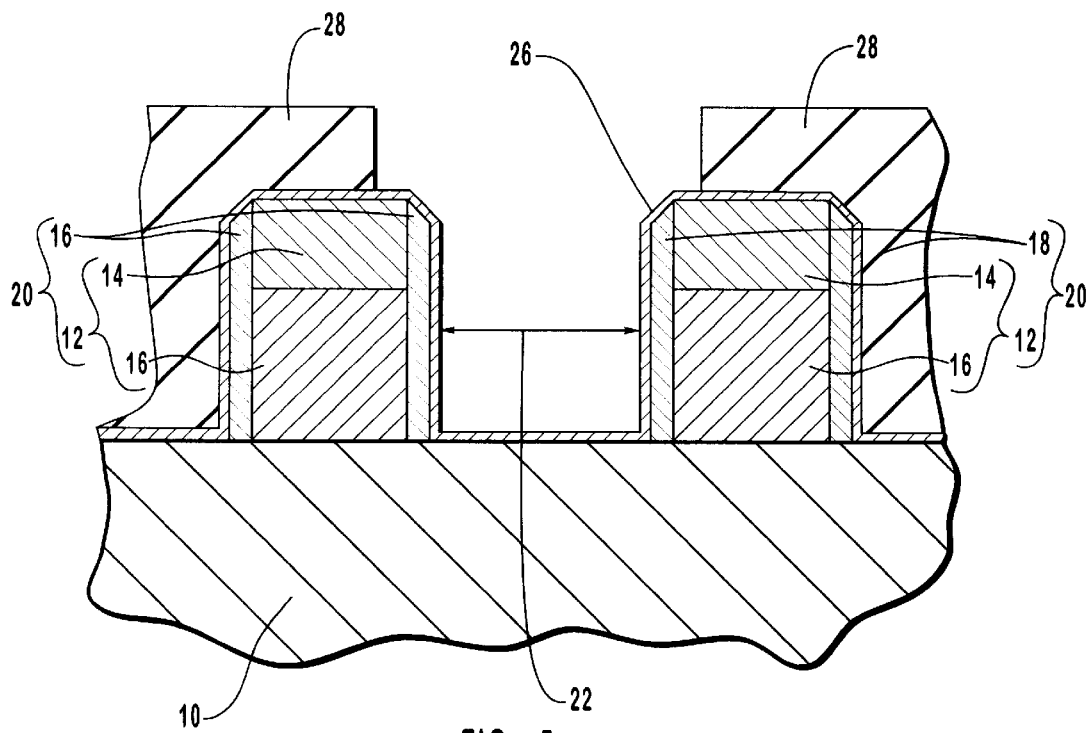
FIG. 5 is the cross section of FIG. 4 after an etch of the etchable layer.

Next etchable layer 28 is etched anisotropically with an etchant selective to silicon nitride over etchable layer 28, such as a fluorine-deficient fluorocarbon plasma. Silicon-rich silicon nitride layer 26 resists a fluorine-deficient etch better than the stoichiometric silicon nitride typically employed in protective layers, providing a more reliable self-aligned etch with less likelihood of etch-through of the top layers 14 and spacers 18 that together enclose each raised structure 20. This is because silicon-rich silicon nitride has less nitride to react with and thereby remove carbon buildup, resulting in greater shielding of the silicon-rich silicon nitride by a carbon film built up during the etch. The etchant is effectively steered around raised structures 20 by silicon-rich silicon nitride layer 26, resulting in the structure shown in FIG. 5. Space 22 between raised structures 20 is self-aligned thereto and remains so after etching. FIG. 2 shows space 22 wider than space 22 seen in FIG. 5 due to the presence of layer 26.

Figure 6:
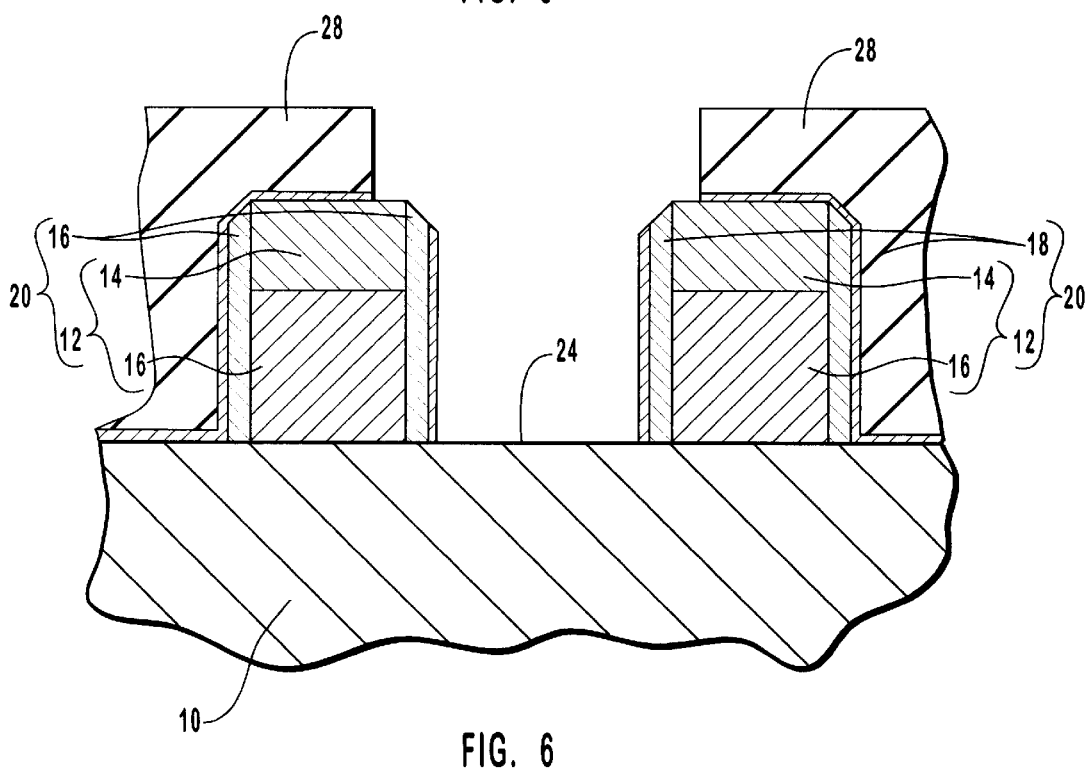
FIG. 6 is the cross section of FIG. 5 after an etch of the thin layer of silicon-rich silicon nitride.

If the self-aligned structures to be formed are contact structures, a short anisotropic silicon nitride etch is performed to remove silicon-rich silicon nitride layer 26 from area 24 of substrate 10 between raised structures 20, exposing area 24 of substrate 10, as shown in FIG. 6. The etch also removes silicon-rich silicon nitride layer 26 from other exposed horizontal surfaces.

Figure 7:
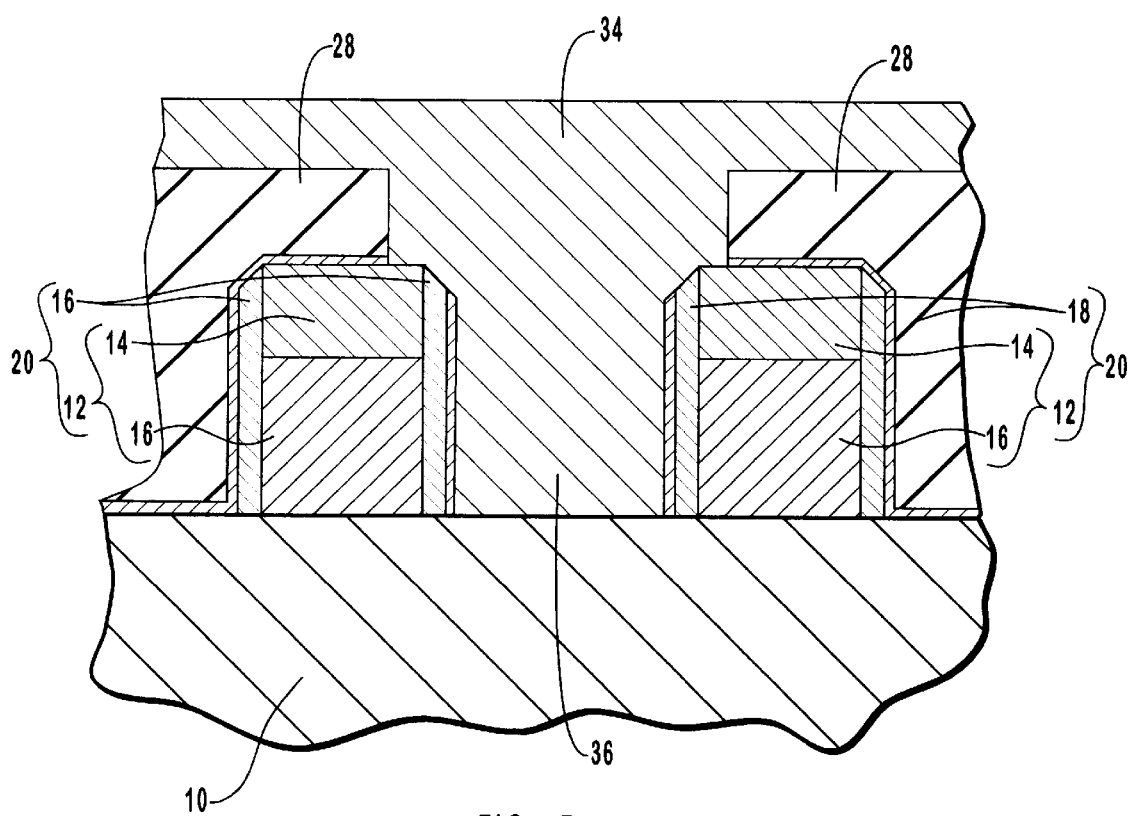
FIG. 7 is the cross section of FIG. 6 after deposition of a fill material.

Next a fill material 34 is deposited over area 24, forming a self-aligned structure 36 comprised of fill material 34 as shown in FIG. 7. In the case of self-aligned contact structures, fill material 34 is a conductive material and self-aligned structure 36 electrically contacts substrate 10 at area 24. Fill material 34 may then be removed down to at least the level of etchable material 28 to isolate individual self-aligned structures such as self-aligned structure 36.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A fabrication method comprising:

forming two raised structures on said substrate having a space therebetween, each said raised structure having a top surface and a side wall projecting from the substrate to terminate at the top surface, each said side wall having a spacer thereon projecting from the substrate and extending to the top surface of the respective raised structure;

forming a layer of silicon-rich silicon nitride conformably over said raised structures, said spacers, and said substrate therebetween;

forming a layer of etchable material over said layer of silicon-rich silicon nitride to fill said space;

forming a mask layer over said layer of etchable material;

patterning said mask layer to expose an area of said layer of etchable material over said space;

etching said etchable layer with an etchant selective to silicon nitride;

removing the layer of silicon-rich silicon nitride to expose a horizontal surface on said substrate between the two raised structures.

2. The method as defined in claim 1, wherein:

removing the layer of silicon-rich silicon nitride comprises etching said layer of silicon-rich silicon nitride to remove said layer of silicon-rich silicon nitride from between said raised structures.

3. The method as defined in claim 1, further comprising:

forming at least one fill material on the horizontal surface on said substrate between the two raised structures to fill said space.

4. The method as defined in claim 3, wherein said at least one fill material comprises an electrically conductive material.

5. The method as defined in claim 4, further comprising:

electrically isolating said at least one fill material above the substrate and between the two raised structures.

6. The method as defined in claim 1, wherein forming the two raised structures on said substrate comprises:

forming on said substrate stack layers including a top layer of a protective material;

patterning said stack layers to form two stacks comprised of said stack layers;

forming over said stacks and said substrate a spacer layer of said protective material; and forming said spacers from said spacer layer.

7. The method as defined in claim 6, wherein said protective material is silicon nitride.

8. The method as defined in claim 6, wherein said protective material is silicon oxide.

9. The method as defined in claim 6, wherein said stacks comprise gate stacks.

10. The method as defined in claim 1, wherein said layer of silicon-rich silicon nitride has a thickness in the range of about 50 Å to about 500 Å.

11. The method as defined in claim 1, wherein the layer of silicon-rich silicon nitride has an index of refraction in the range of about 2.1 to about 2.6.

12. The method as defined in claim 1, wherein:
said etchable material comprises an oxide of silicon; and
forming a layer of etchable material over said layer of silicon-rich silicon nitride comprises depositing and reflowing said oxide of silicon.

13. A fabrication method comprising:
forming two raised structures on a substrate, an area of said substrate lying between said raised structures, each said raised structure having a top surface and a side wall projecting from the substrate to terminate at the top surface, each said side wall having a spacer thereon projecting from the substrate and extending to the top surface of the respective raised structure;
depositing conformably over said raised structures, said spacers, and said area of said substrate lying therebetween a layer of silicon-rich silicon nitride having a thickness within the range of about 50 to about 500 Angstroms and an index of refraction in the range of about 2.1 to about 2.6;
depositing a layer of etchable material over said layer of silicon-rich silicon nitride to fill a space above said area of said substrate and to provide a horizontal top surface on said layer of etchable material;
forming a mask layer over said layer of etchable material;
patterning said mask layer to expose an area of said layer of etchable material above said area of said substrate;
etching said etchable layer with an etchant selective to silicon nitride to remove said etchable layer above said area of said substrate;
etching said layer of silicon-rich silicon nitride to remove said layer of silicon-rich silicon nitride from said area of said substrate; and
depositing a conductive material on said area of said substrate; and
planarizing said conductive material to electrically isolate said conductive material above the substrate and between the two raised structures.

14. The method as defined in claim 13, wherein
said raised structures comprise gate stacks enclosed in said spacers; and
said area of said substrate comprises a source/drain region.

15. The method as defined in claim 13, wherein:
said etchable material comprises BPSG; and
depositing said layer of etchable material over said layer of silicon-rich silicon nitride comprises depositing and reflowing said BPSG.

16. The method as defined in claim 13, wherein etching said etchable layer with an etchant selective to silicon nitride to remove said etchable layer above said area of said substrate comprises anisotropically etching in a fluorine-deficient plasma.

17. An etching method comprising:
providing a substrate having two raised structures thereon with an area of said substrate lying between said two raised structures, each said raised structure having a top surface and a side wall projecting from the substrate to terminate at the top surface, each said side wall having a spacer thereon projecting from the substrate and extending to the top surface of the respective raised structure, each said spacer being composed of an electrically insulative material;
depositing conformably over said raised structures, said spacers, and said area of said substrate lying between said raised structures a layer of silicon-rich silicon nitride having a thickness within the range of about 50 to about 500 Angstroms and an index of refraction in the range of about 2.1 to about 2.6;
forming an oxide of silicon over said layer of silicon-rich silicon nitride;
etching said oxide of silicon with an etchant selective to silicon nitride to expose the layer of silicon-rich silicon nitride that is situated between said raised structures;
removing the layer of silicon-rich silicon nitride to expose the substrate between the two raised structure;
depositing a conductive material on the substrate, between and on the two raised structures, and in contact with the spacers on the raised structures; and
removing the conductive material that is situated above the substrate and above the two raised structures to electrically isolate said conductive material above the substrate and between the two raised structures.

18. The method as defined in claim 17, wherein etching said oxide of silicon with an etchant selective to silicon nitride comprises:
forming a mask layer over said oxide of silicon;
patterning said mask layer to expose an area of said oxide of silicon above said area of said substrate; and
anisotropically etching said oxide of silicon with an etchant selective to silicon nitride to remove said oxide of silicon above said area of said substrate.

19. The method as defined in claim 17, wherein said oxide of silicon comprises BPSG.

20. A fabrication method comprising:
forming a pair of gate stacks projecting from a semiconductor substrate, the semiconductor substrate having an active area therein that is situated between the two gate stacks, each said gate stack having a side wall with a spacer thereon, each said spacer being composed of an electrically insulative material;
forming a layer of silicon-rich silicon nitride over said two gate stacks, the spacers on the side walls of the gate stacks, and upon the active area;
forming a layer of an oxide of silicon over said layer of silicon-rich silicon nitride to between the two gate stacks;
removing the layer of the oxide of silicon between the two gate stacks;
removing the layer of silicon-rich silicon nitride to expose the active area on the semiconductor substrate between the two gate stacks;
forming an electrically conductive material over the two gate stacks and upon the active area;
electrically isolating the electrically conductive material that is situated above the semiconductor substrate and between the two gate stacks.

21. The method as defined in claim 20, wherein electrically isolating the electrically conductive material is a planarization process to remove the electrically conductive material that is situated between and above the gate stacks.

22. A fabrication method comprising:

forming a pair of gate stacks projecting from a semiconductor substrate, each gate stack being electrically insulated above the semiconductor substrate by a protective covering composed of a dielectric material, the semiconductor substrate having an active area therein that is situated between the two gate stacks;

forming a layer of silicon-rich silicon nitride having an index of refraction in the range of about 2.1 to about 2.6 over the protective covering upon the two gate stacks and upon the active area;

forming a layer of an oxide of silicon over said layer of silicon-rich silicon nitride between the two gate stacks;

removing the layer of the oxide of silicon that is situated between the two gate stacks to expose the layer of silicon-rich silicon nitride that situated between the two gate stacks;

removing the layer of silicon-rich silicon nitride to expose the active area on the semiconductor substrate between the two gate stacks.

23. The method as defined in claim 22, further comprising:

forming an electrically conductive material over the protective covering upon the two gate stacks and upon the active area, the electrically conductive material extending from the active area above the protective covering of each said gate stack;

removing the electrically conductive material that extends above the protective covering of each said gate stack and that is situated between the two gate stacks.

24. The method as defined in claim 22, wherein the protective covering is composed of silicon nitride.

25. A fabrication method comprising:

forming a pair of gate stacks projecting from a semiconductor substrate, each gate stack having a side intersecting with a top, said side and top of each said gate stack being electrically insulated above the semiconductor substrate by a protective covering composed of a dielectric material, the semiconductor substrate having an active area therein that is situated between the two gate stacks;

forming a layer of silicon-rich silicon nitride having an index of refraction in the range of about 2.1 to about 2.6 over the protective covering upon the two gate stacks and upon the active area;

forming a layer of an oxide of silicon over said layer of silicon-rich silicon nitride between the two gate stacks;

removing the layer of the oxide of silicon that is situated between the two gate stacks to silicon nitride to expose the layer of silicon-rich silicon nitride that situated:

on the protective material that is on the side of each said gate stack;

on the semiconductor substrate between the two gate stacks, wherein a portion of said layer of oxide remains on the layer of silicon-rich silicon nitride that is on the protective covering that is on the top of each said gate stack;

removing the layer of silicon-rich silicon nitride that is situated upon the semiconductor substrate to expose the active area on the semiconductor substrate between the two gate stacks, wherein the layer of silicon-rich silicon nitride remains on the protective covering on the side of each said gate stack.

26. The method as defined in claim 25, further comprising:

forming an electrically conductive material:

upon the layer of oxide that remain on the layer of silicon-rich silicon nitride that is on the protective covering that is on the top of each said gate stack;

upon the semiconductor substrate between the two gate stacks;

upon the layer of silicon-rich silicon nitride remains on the protective covering on the side of each said gate stack.

27. The method as defined in claim 25, further comprising:

removing the electrically conductive material that extends above the layer of oxide that remain on the layer of silicon-rich silicon nitride that is on the protective covering that is on the top of each said gate stack.

* * * * *

UNITED STATES PATENT AND TRADEMARK OFFICE
CERTIFICATE OF CORRECTION

PATENT NO. : 6,117,767
DATED : September 12, 2000
INVENTOR(S) : Bradley J. Howard Page 1 of 1

It is certified that error appears in the above-identified patent and that said Letters Patent is hereby corrected as shown below:

Column 1,
Line 26, please change "shielded previously" to -- shielded, previously --

Column 7,
Line 20, please change "nitride that situated" to -- nitride situated --

Column 8,
Line 11, please change "nitride that situated" to -- nitride situated --
Line 29, please change "remain on" to -- remains on --
Line 34, please change "remains on" to -- remaining on --
Line 40, please change "remain on" to -- remains on --

Signed and Sealed this

Sixth Day of November, 2001

*Attest:*

NICHOLAS P. GODICI
*Attesting Officer*     *Acting Director of the United States Patent and Trademark Office*